United States Patent
Zhu et al.

(10) Patent No.: US 7,659,789 B2
(45) Date of Patent: Feb. 9, 2010

(54) SIGNAL MODULATION SCHEME IN CLASS-D AMPLIFICATION AND CIRCUIT THEREFOR

(75) Inventors: Hao Zhu, Anhui Province (CN); Haibin Huang, Shanghai (CN); Yongqing Ren, Shanghai (CN)

(73) Assignee: Apexone Microelectronics Ltd., Shanghai (CN)

( * ) Notice: Subject to any disclaimer, the term of this patent is extended or adjusted under 35 U.S.C. 154(b) by 0 days.

(21) Appl. No.: 10/596,989

(22) PCT Filed: Feb. 9, 2006

(86) PCT No.: PCT/CN2006/000210

§ 371 (c)(1),
(2), (4) Date: Jul. 3, 2006

(87) PCT Pub. No.: WO2007/090315

PCT Pub. Date: Aug. 16, 2007

(65) Prior Publication Data

US 2009/0179709 A1    Jul. 16, 2009

(51) Int. Cl.
*H03K 7/08* (2006.01)

(52) U.S. Cl. .................... 332/109; 332/110; 330/10
(58) Field of Classification Search ......... 332/109–111; 330/10
See application file for complete search history.

(56) References Cited

U.S. PATENT DOCUMENTS 6,847,257 B2 *  1/2005  Edwards et al. ............... 330/10

* cited by examiner

*Primary Examiner*—David Mis

(57) ABSTRACT

A class-D amplifier (10) includes a logic circuit (40) for controlling the operation of a switching bridge (11). The logic circuit (40) transmits the differential mode of a differential pulse width modulation input signal and deletes a central portion of the common mode of input signal, while preserving pulses of a minimum pulse width following a rising edge and preceding a falling edge in common mode of the input signal. Deleting the central portion of the common mode signal improves the efficiency and reduces the electromagnetic interference radiation of the class-D amplifier (10). Preserving the pulses of the minimum pulse width ensures the proper operation of the switching elements (12, 14, 16, 18) in the switching bridge (11), thereby reducing the distortion in the signal amplification.

20 Claims, 3 Drawing Sheets

SIGNAL MODULATION SCHEME IN CLASS-D AMPLIFICATION AND CIRCUIT THEREFOR

FIELD OF THE INVENTION

The present invention generally relates to signal modulation and, more particularly, to signal modulation schemes in switching amplification applications.

BACKGROUND OF THE INVENTION

A switching amplifier, also known as a class-D amplifier, has an output that is switched or pulse-width modulated at a frequency much higher than the frequency of interest. A class-D amplifier is generally significantly more efficient than a class-AB amplifier and is especially suitable for applications in portable electronics devices, e.g., portable compact disc players, digital video disc players, MP3 players, etc. However, a traditional class-D amplifier requires an output filter, which would significantly increase the size, weight, and cost of the amplifier. In addition, a class-D amplifier may use a bridge output stage topology that switches in a binary fashion. In such a switching process, there is always a current in the load. When there is no input signal, the amplifier operates near zero crossing and the majority of the current used is wasted, resulting in a drop in efficiency.

A signal modulation scheme may enable a class-D amplifier to operate without an output filter. The scheme includes delivering current to the load only when needed, and once delivered, maintaining the current, instead of removing the current that results in the energy loss. When an input signal is present, the resulting differential signal across the load consists of narrow pulses with polarity determined by the polarity of the input signal. These narrow pulses also double the differential PWM frequency. This then achieves the desired effect of placing current into the load only when needed, resulting in less energy loss in the load and therefore and increased efficiency.

Eliminating the output filter in a class-D amplifier causes the amplifier to radiate electromagnetic interference (EMI) from the wires connecting the amplifier to the load. A change in current generates a magnetic field, while a change in a voltage results in an electric field, both of which may cause EMI. The electric field, which is a common-mode effect, could be significant if the load, e.g., speaker, wires are long. EMI negatively affects the operation of the amplifier and other electronic devices. Furthermore, EMI radiation decreases the efficiency of the amplifier.

Accordingly, it would be advantageous to have a signal modulation scheme that substantially eliminates EMI in the operation of a filterless class-D amplifier. It is desirable if the signal modulation scheme does not introduce signal distortion while eliminating EMI. It is also desirable to have a class-D amplifier that is energy efficient. It is further desirable for the class-D amplifier to be simple and reliable. It is would be of further advantage for the amplifier to be cost efficient.

DETAILED DESCRIPTION OF VARIOUS EMBODIMENTS

Figure 1:
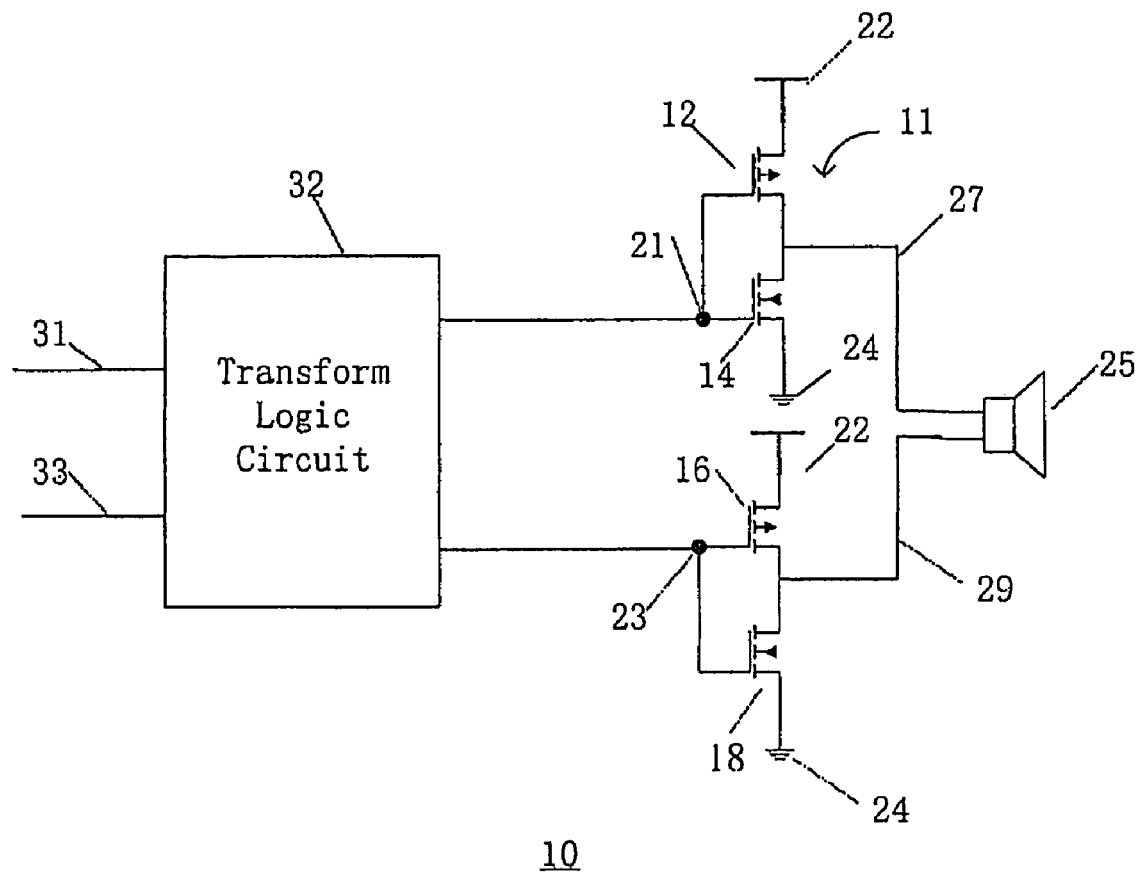
FIG. 1 is a schematic diagram illustrating a class-D amplifier in accordance with an embodiment of the present invention.

Various embodiments of the present invention are described herein below with reference to the figures, in which elements of similar structures or functions are represented by like reference numerals throughout the figures. It should be noted that the figures are only intended to facilitate the description of the preferred embodiments of the present invention. They are not intended as an exhaustive description of the present invention or as a limitation on the scope of the present invention.

FIG. 1 is a schematic diagram illustrating a class-D amplifier 10 in accordance with an embodiment of the present invention. Class-D amplifier 10 includes an H-bridge 11 comprised of switches 12, 14, 16, and 18. By way of example, FIG. 1 shows switches 12 and 16 being P-channel field effect transistors (FETs) and switches 14 and 18 being N-channel FETs. P-channel FET 12 and N-channel FET 14 are serially coupled between a first voltage level, e.g., a supply voltage 22, and a second voltage level, e.g., a ground voltage 24. Specifically, the gate electrodes of FETs 12 and 14 are connected together to form a first input terminal 21 of H-bridge 11; the source electrodes of FETs 12 and 14 are connected to supply voltage 22 and ground voltage 24, respectively; and the drain electrodes of FETs 12 and 14 are connected together to form a first output terminal 27 of H-bridge 11. Likewise, P-channel FET 16 and N-channel FET 18 are serially coupled between supply voltage 22, and ground voltage 24. Specifically, the gate electrodes of FETs 16 and 18 are connected together to form a second input terminal 23 of H-bridge 11; the source electrodes of FETs 16 and 18 are connected to supply voltage 22 and ground voltage 24, respectively; and the drain electrodes of FETs 16 and 18 are connected together to form a second output terminal 29 of H-bridge 11. FETs 12 and 16 are also referred to as pull-up switches and FETs 14 and 18 are also referred to as pull-down switches. In accordance with a preferred embodiment, output terminals 27 and 29 of H-bridge 11 also serve as the output terminals of class-D amplifier 10. A load 25 is coupled between output terminals 27 and 29. Class-D amplifier 10 also includes a transform logic circuit 32 for processing pulse width modulation (PW signals for class-D amplifier 10. Transform logic circuit 32 has input terminals 31 and 33 coupled for receiving the input signals for class-D amplifier 10. Furthermore, transform logic circuit 32 has two output terminals coupled to input terminals 21 and 23 of H-bridge 11.

Transform logic circuit 32 processes a differential PWM input signal at input terminals 31 and 33 to generate a control signal for H-bridge 11. In accordance with an embodiment of the present invention, transform logic circuit 32 deletes a significant portion of the common mode component from the input PWM signal, thereby substantially deleting the voltage at load 25 and the current flowing through wires connected to load 25 during the major portion of the common mode component. Reducing the voltage at load 25 and the current flowing through the wires connected to load 25 during the common mode component of the PWM signal is beneficial in reducing the electromagnetic interference (EMI) radiation and improving the efficiency of class-D amplifier 10.

Figure 2:
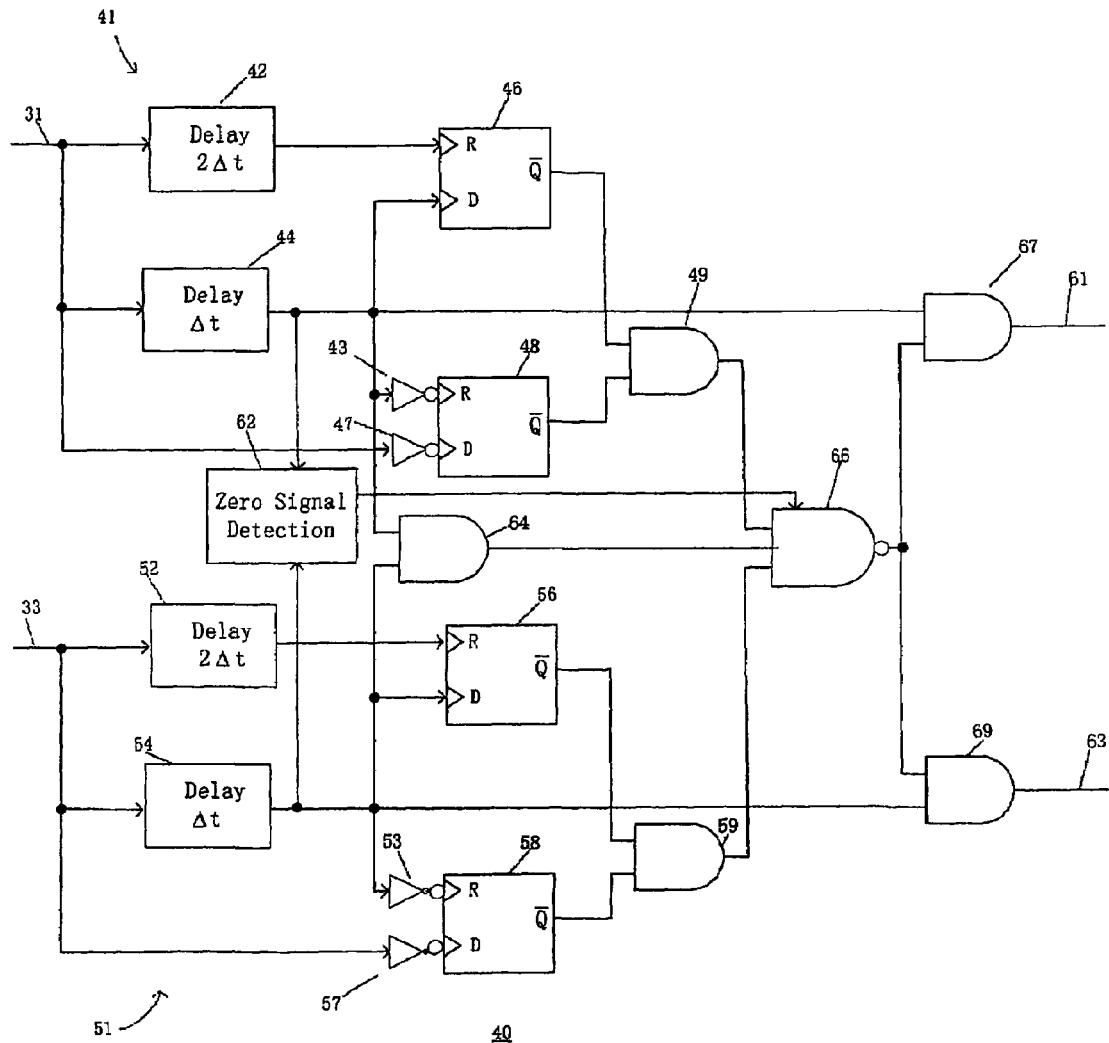
FIG. 2 is a functional block diagram illustrating a transform logic circuit in accordance with an embodiment of the present invention.

FIG. 2 is a functional block diagram illustrating a transform logic circuit 40 in accordance with an embodiment of the present invention. In accordance with a preferred embodiment of the present invention, transform logic circuit 40 generates a control signal to a switching circuit in a nonlinear amplifier. Therefore, transform logic circuit 40 is also referred to as a control circuit. By way of example, a popular application of such a nonlinear amplifier is in high efficiency audio amplification in portable audio devices. It should be noted that control circuit 40 in accordance with the present invention can be used for controlling switching circuits in other amplification applications. Also by way of example, control circuit 40 functions as transform logic circuit 32 for controlling H-bridge 11 in amplifier 10 shown in FIG. 1 in accordance with an embodiment of the present invention.

In accordance with a specific embodiment of the present invention and as shown in FIG. 2, control circuit 40 includes a first channel signal processing element 41 coupled to a first input terminal 31 and a second channel signal processing element 51 coupled to a second input terminal 33. First channel signal processing element 41 includes delay gates 42 and 44, memory elements 46 and 48, and a logic gate 49. Second channel signal processing element 51 includes delay gates 52 and 54, memory elements 56 and 58, and a logic gate 59. Control circuit 40 also includes a signal detection element 62 and logic gates 64, 66, 67, and 69.

In first channel signal processing element 41, first input terminal 31 is connected to an input of delay gate 42 and to an input of delay gate 44, and coupled to a data input of memory element 48 via an inverter 47. An output of delay gate 42 is connected to a reset input of memory element 46. An output of delay gate 44 is connected to a data input of memory element 46 and to a first input of logic gate 64, and coupled to a reset input of memory element 48 via an inverter 43. An output of memory element 46 and an output of memory element 48 are connected to two inputs of logic gate 49. An output of logic gate 49 is coupled for transmitting a control signal output of first channel signal processing element 41.

In second channel signal processing element 51, second input terminal 33 is connected to an input of delay gate 52 and to an input of delay gate 54, and coupled to a data input of memory element 58 via an inverter 57. An output of delay gate 52 is connected to a reset input of memory element 56. An output of delay gate 54 is connected to a data input of memory element 56 and to a second input of logic gate 64, and coupled to a reset input of memory element 58 via an inverter 53. An output of memory element 56 and an output of memory element 58 are connected to two inputs of logic gate 59. An output of logic gate 59 is coupled for transmitting a control signal output of second channel signal processing element 51.

The output of delay gate 44 is also connected to a first input of logic gate 67. The output of delay gate 54 is also connected to a first input of logic gate 69. The outputs of logic gates 49, 59, and 64 are connected to three inputs of logic gate 66. The outputs of delay gates 44 and 54 are also connected to signal detection element 62. An output of signal detection element 62 is coupled to an override input of logic gate 66. An output of logic gate 66 is coupled to the second inputs of logic gates 67 and 69. The outputs of logic gates 67 and 69 are coupled to output terminals 61 and 63, respectively, of control circuit 40.

In accordance with a preferred embodiment of the present invention, the delay times of delay gates 42 and 44 in first channel signal processing element 41 are substantially equal to the delay times of delay gates 52 and 54, respectively, in second channel signal processing element 51. Furthermore, delay gates 42 and 52 preferably having delay times different from those of delay gates 44 and 54, respectively. In accordance with a preferred embodiment of the present invention, the delay times of delay gates 42 and 52 are greater than those of delay gates 44 and 54, respectively, by a predetermined time interval $\Delta t$. In a specific embodiment, delay gates 44 and 54 have a delay time $\Delta t$, and delay gates 42 and 52 have a delay time $2\Delta t$. Also in accordance with a specific embodiment of the present invention shown in FIG. 2, logic gates 49, 59, 64, 67, and 69 are AND gates, and logic gate 66 is a NAND gate. Furthermore in accordance with a preferred embodiment of the present invention, memory elements 46, 48, 56, and 58 are one-bit memory elements that are also referred to as latches or bistable gates. By way of example, a logic high signal at the data input of a bistable gate triggers a logic high signal at its output and a logic low signal at its inverting output. A logic high signal at the reset input of the bistable gate resets the output and the inverting output to logic low and high, respectively.

In response to a rising edge in the first channel or component of the PWM signal at input terminal 31, the voltage level at the data input of bistable gate 46, which is coupled to input terminal 31 via delay gate 44, switches to a logic high level after a time interval $\Delta t$, resulting in a logic low state at the inverting output of bistable gate 46. The voltage level at the reset input of bistable gate 46, which is coupled to input terminal 31 via delay gate 42, switches to a logic high level after a time interval $2\Delta t$, resulting in the inverting output of bistable gate 46 being reset back to a logic high state. Therefore, the rising edge in the first channel signal causes the inverting output of bistable gate 46 switching from logic high to logic low at a time $\Delta t$ after the rising edge and for a period of $\Delta t$. Because the data and reset inputs of bistable gate 48 are coupled to input terminal 31 and the output of delay gate 44 via inverters 43 and 47, respectively, the rising edge in the first channel signal does not trigger or reset bistable gate 48.

In response to a falling edge in the first channel or component of the PWM signal at input terminal 31, the voltage level at the data input of bistable gate 48, which is coupled to input terminal 31 via inverter 47, switches to a logic high level, resulting in a logic low state at the inverting output of bistable gate 48. The voltage level at the reset input of bistable gate 48, which is coupled to input terminal 31 via delay gate 44 and inverter 43, switches to a logic high level after a time interval $\Delta t$, resulting in the inverting output of bistable gate 48 being reset back to a logic high state. Therefore, the falling edge in the first channel signal causes the inverting output of bistable gate 48 switching from logic high to logic low for a period of $\Delta t$. Because the data and reset inputs of bistable gate 46 are connected to the outputs of delay gates 42 and 44, respectively, the falling edge in the first channel signal does not trigger or reset bistable gate 46.

Likewise, in response to a rising edge in the second channel or component of the PWM signal at input terminal 33, the voltage level at the data input of bistable gate 56, which is coupled to input terminal 33 via delay gate 54, switches to a logic high level after a time interval $\Delta t$, resulting in a logic low state at the inverting output of bistable gate 56. The voltage level at the reset input of bistable gate 56, which is coupled to input terminal 33 via delay gate 52, switches to a logic high level after a time interval $2\Delta t$, resulting in the inverting output of bistable gate 56 being reset back to a logic high state. Therefore, the rising edge in the second channel signal causes the inverting output of bistable gate 56 switching from logic high to logic low at a time $\Delta t$ after the rising edge and for a period of $\Delta t$. Because the data and reset inputs of bistable gate 58 are coupled to input terminal 33 and the output of delay gate 54 via inverters 53 and 57, respectively, the rising edge in the second channel signal does not trigger or reset bistable gate 58.

In response to a falling edge in the second channel or component of the PWM signal at input terminal 33, the voltage level at the data input of bistable gate 58, which is coupled to input terminal 33 via inverter 57, switches to a logic high level, resulting in a logic low state at the inverting output of bistable gate 58. The voltage level at the reset input of bistable gate 58, which is coupled to input terminal 33 via delay gate 54 and inverter 53, switches to a logic high level after a time interval Δt, resulting in the inverting output of bistable gate 58 being reset back to a logic high state. Therefore, the falling edge in the second channel signal causes the inverting output of bistable gate 58 switching from logic high to logic low for a period of Δt. Because the data and reset inputs of bistable gate 56 are connected to the outputs of delay gates 52 and 54, respectively, the falling edge in the second channel signal does not trigger or reset bistable gate 56.

AND gate 49 combines the output signals of bistable gates 46 and 48. The output of AND gate 49 is at the logic high level except during a time interval of Δt following a rising edge and a time interval of Δt proceeding a falling edge in the first channel signal at input terminal 31. Likewise, AND gate 59 combines the output signals of bistable gates 56 and 58. The output of AND gate 59 is at the logic high level except during a time interval of Δt following a rising edge and a time interval of Δt proceeding a falling edge in the second channel signal at input terminal 33.

AND gate 64 combines the input signals of the two channels at the outputs of delay gates 44 and 54 and generates a logic high voltage level in response to both channels of the input differential PWM signal being at a logic high voltage level, i.e., the differential PWM signals being in the logic high common mode. NAND gate 66 combines the output signals from AND gates 49, 59, and 64 and generates a logic low voltage signal during a portion of the common mode starting from time Δt following a rising edge and ending at time Δt proceeding a falling edge. If a pulse in the input signals is narrower than Δt, the output of NAND gate 66 stays at the logic high voltage level throughout the pulse width.

AND gate 67 combines the outputs of delay gate 44 and NAND gate 66. AND gate 67 functions as a switch for the first channel signal controlled by the output of NAND gate 66. When the output of NAND gate 66 is at logic high, AND gate 67 is functionally on and transmits the first channel signal from input terminal 31 to output terminal 61 through delay gate 44 of control circuit 40. When the output of NAND gate 66 is at logic low, AND gate 67 is functionally off and blocks the first channel signal transmission path from input terminal 31 to output terminal 61. Likewise, AND gate 69 combines the outputs of delay gate 54 and NAND gate 66. AND gate 69 functions as a switch for the second channel signal controlled by NAND gate 66. When the output of NAND gate 66 is at logic high, AND gate 69 is functionally conductive, transmitting the second channel signal from input terminal 33 to output terminal 63 through delay gate 54. When the output of NAND gate 66 is at logic low, AND gate 69 is functionally nonconductive, blocking the second channel signal transmission path from input terminal 33 to output terminal 63 of control circuit 40.

Therefore, the output of control circuit 40 is a modified differential PWM signal. Control circuit 40 deletes a portion of the common mode component in the input differential PWM signal, while preserving pulses of a predetermined minimum width Δt near the rising and falling edges of the PWM signal. Deleting the common mode component of the differential PWM signal is beneficial in reducing the EMI radiation and improving the efficiency of a nonlinear amplifier employing control circuit 40, e.g., class-D amplifier 10 shown in FIG. 1. In accordance with the present invention, the minimum pulse width Δt is determined by the minimum pulse width for reliably switching on and off FETs 12, 14, 16, and 18 in H-bridge 11. Preserving pulses of the minimum width Δt ensures that FETs 12, 14, 16, and 18 switch on and off properly and reliably.

Signal detection element 62 detects the differential mode component in the differential PWM input signals. If the differential mode component is below a predetermined level, signal detection element 62 generates logic signal, which is transmitted to the override input of NAND gate 66. In response to the logic signal at the override input, NAND gate 66 generates a logic low voltage level at its output regardless of the status of the input signals at its three input. In accordance with a preferred embodiment of the present invention, the predetermined level that triggers the override signal is a time difference between the corresponding edges of the two channel signals significantly less than a predetermined value. In accordance with a specific embodiment of the present invention, the predetermined time difference level for triggering the override signal is significantly smaller than the minimum pulse width, Δt. When the time difference between the two channel signals is less than the predetermined level, the substantially zero differential mode component is ignored and the two channel signals are considered to be completely in the common mode. This corresponds to substantially no input signal in amplification applications. Therefore, signal detection element 62 is also referred to as a zero signal detection element or zero differential mode signal detection element. Implementing signal detection element 62 in control circuit 40 in accordance with a preferred embodiment of the present invention prevents narrow current pulses that do not generate noticeable output, e.g., audio signals, from flowing through load 25. This is beneficial in further reducing the power consumption and EMI radiation of amplifier 10 without deterioration in the output fidelity.

It should be understood that FIG. 2 illustrates an exemplary embodiment of control circuit 40 in accordance with the present invention. Variations to different elements of control circuit 40 shown in FIG. 2 can be made by those skilled in the art without depart from the true spirit of the present invention. For example, delay gates 42 and 44 can be replaced with two serially coupled delay gages each with a delay time equal to the minimum pulse width Δt and so can delay gates 52, and 54. Also for example, AND gate 49 coupled to the inverting outputs of bistable gates 46 and 48 can be replaced with a NOR gate coupled to non-inverting outputs of bistable gates 46 and 48. Likewise, AND gate 59 coupled to the inverting outputs of bistable gates 56 and 58 can be replaced with a NOR gate coupled to non-inverting outputs of bistable gates 56 and 58. Furthermore, AND gates 67 and 69 can be replaced with switching elements or devices, e.g., field effect transistors, with control electrodes coupled to the output of NAND gate 66. In accordance with an alternative embodiment of the present invention, an Exclusive NOR gate replaces AND 64 in control circuit 40 shown in FIG. 4. In addition, zero signal detection element 62 for detecting the absence of input signal is optional in control circuit 40 in accordance with the present invention. Furthermore, instead of being coupled to the override input of NAND gate 66, the output of signal detection element 62 may be coupled to override inputs or third inputs of AND gates 67 and 69.

Figure 3:
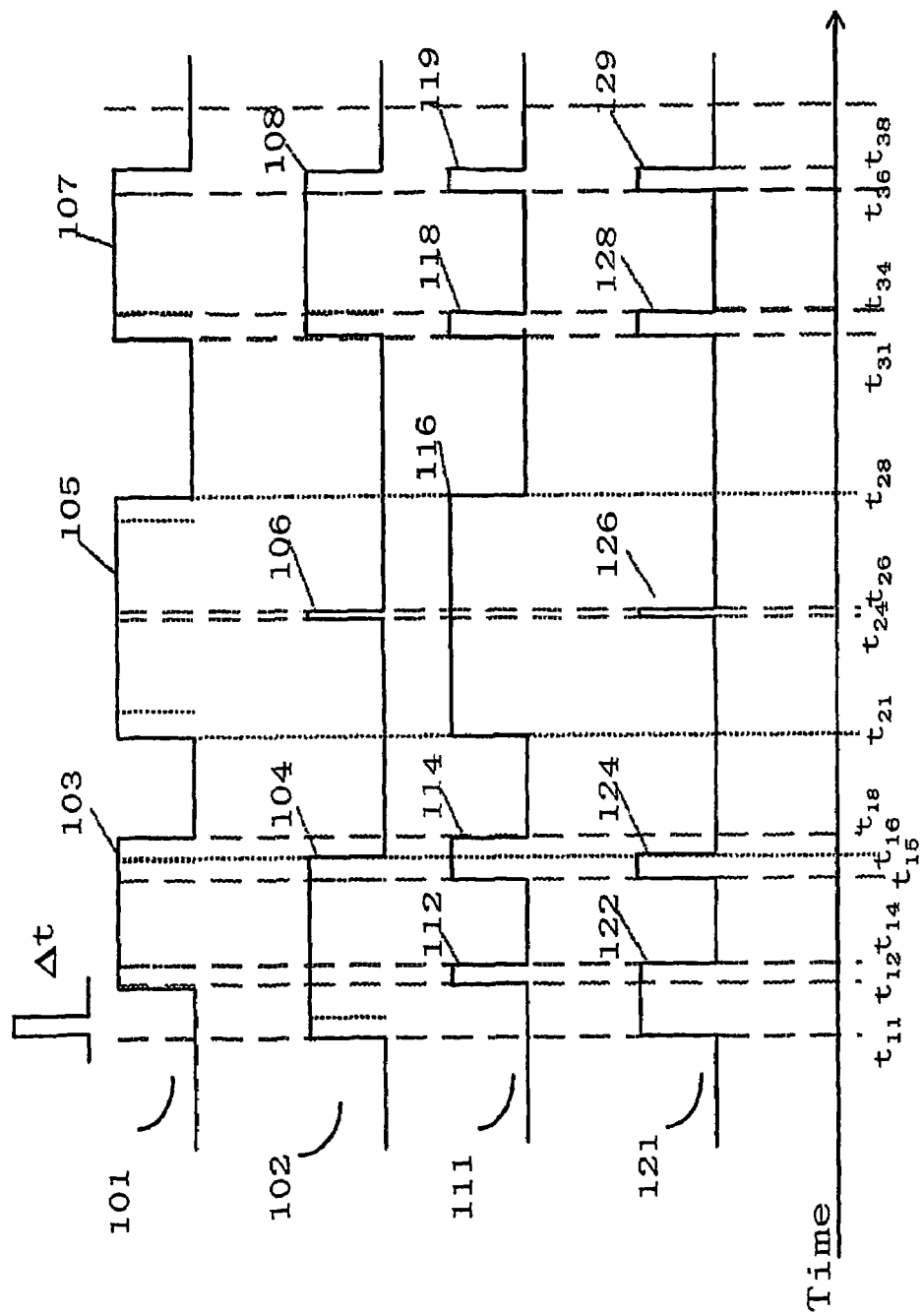
FIG. 3 is a timing diagram illustrating pulse signal modulation in accordance with an embodiment of the present invention.

FIG. 3 is a timing diagram illustrating a pulse signal modulation scheme or process in accordance with an embodiment of the present invention. By way of example, FIG. 3 illustrates the input and output signals of control circuit 40 shown in FIG. 2 in accordance with a preferred embodiment of the present invention. Also by way of example, control circuit 40 can be implemented as transform logic circuit 32 to drive H-bridge 11 in class-D amplifier 10 shown in FIG. 1. In FIG. 3, signals 101 and 102 represent two channels or components of a differential PWM signal at input terminals 31 and 33, respectively, of control circuit 40, and signals 111 and 121 represent two channels or components of a modified or modulated PWM signal at output terminals 61 and 63, respectively, of control circuit 40. By way of example and to facilitate the description of the pulse signal modulation scheme in accordance with a preferred embodiment of the present invention, FIG. 3 specifically shows the input and output signals of control circuit 40 in three exemplary operation modes. FIG. 3 also shows time interval Δt, the predetermined minimum pulse width. It should noted that time axis in FIG. 3 is for illustrative purpose only and does not necessarily represent an absolute time. Therefore, the coincidence of edges of the pulses of the input signals 101 and 102 and output signals 111 and 121 does not represents that they rise and fall at the same time. Because of the signal transmission or propagation delays in control circuit 40, the output signals generally have a time delay with respect to the input signals. Specifically, the output signals has a time delay Δt with respect to the input signals due to delay gates 44 and 54 in the signal transmission paths. The time coincidences of input and output signals shown in FIG. 3 are intended to indicate logic and causal relationship between the input and output signals.

Between time $t_{11}$ and time $t_{18}$, FIG. 3 illustrates a first exemplary operation mode, in which input differential PWM signals 101 and 102 have both significant differential mode and common mode components. Signal 102 has a pulse 104 with a rising edge at time $t_{11}$ and a falling edge at time $t_{16}$, and signal 101 has a pulse 103 with a rising edge at time $t_{12}$ and a falling edge at time $t_{18}$. Therefore, signals 101 and 102 are in common mode between time $t_{12}$ and time $t_{16}$. Between time $t_{11}$ and time $t_{12}$ and between time $t_{16}$ and time $t_{18}$, signals 101 and 102 are in differential mode. By way of example, a time difference between time $t_{11}$ and time $t_{12}$ is greater than the predetermined minimum pulse width Δt and a time difference between time $t_{16}$ and time $t_{18}$ is less than Δt.

Before time $t_{11}$, signals 101 and 102 are at logic low. The inverting outputs of bistable gates 46, 48, 56, and 58 are at logic high. The output of AND gate 64 is at logic low. At time $t_{11}$, a rising edge of pulse 104 in second channel signal 102 reaches input terminal 33. The rising edge of pulse 104 is transmitted to the data input of bistable gate 56 through delay gate 54. In response to the rising edge at its data input, bistable gate 56 generates a logic low signal at its inverting output. In a time interval Δt thereafter, the rising edge of pulse 104 is transmitted to the reset input of bistable gate 56 via delay gate 52. In response to the rising edge at its reset input, bistable gate 56 resets its inverting output to logic high. The rising edge of pulse 104 does not trigger bistable gates 46, 48, and 58 and their inverting outputs remain at logic high. Therefore, AND gate 59 switches to logic low for a period of Δt following time $t_{11}$ in response to the rising edge of pulse 104 in second channel input signal 102.

Between time $t_{11}$ and time $t_{12}$, signal 101 at input terminal 31 is at a logic low and signal 102 at input terminal 33 is at a logic high. The input signal is in a differential mode. Delay gates 44 and 54 transmit the logic low and logic high signals, respectively, to the two inputs of AND gate 64. AND gate 64 generates a logic low signal. At time $t_{12}$, a rising edge of pulse 103 in first channel signal 101 reaches input terminal 31. The rising edge of pulse 103 is transmitted to the data input of bistable gate 46 through delay gate 44 at a time Δt after time $t_{12}$. In response to the rising edge in the signal at its data input, bistable gate 46 generates a logic low signal at its inverting output. At a time 2Δt after time $t_{12}$, the rising edge of pulse 103 is transmitted to the reset input of bistable gate 46 via delay gate 42. In response to the rising edge in the signal at its reset input, bistable gate 46 resets its inverting output to logic high. The rising edge of pulse 103 does not trigger bistable gates 48, 56, and 58 and their inverting outputs remain at logic high. Therefore, AND gate 49 switches to logic low for a period between time $t_{12}$ and time $t_{14}$, which is a time interval Δt following time $t_{12}$, in response to the rising edge of pulse 103 in first channel input signal 101.

Between time $t_{12}$ and time $t_{16}$, both signal 101 at input terminal 31 and signal 102 at input terminal 33 are at logic high. The input signal is in a logic high common mode. Delay gates 44 and 54 transmit the logic high signals to the two inputs of AND gate 64. AND gate 64 generates a logic high signal between time $t_{12}$ and time $t_{16}$. At time $t_{16}$, a falling edge of pulse 104 in second channel signal 102 reaches input terminal 33. The falling edge of pulse 104 is transmitted to the data input of bistable gate 58 through inverter 57. In response to the rising edge in the signal at its data input, bistable gate 58 generates a logic low signal at its inverting output. In a time interval Δt thereafter, the falling edge of pulse 104 is transmitted to the reset input of bistable gate 58 via delay gate 54 and inverter 53. In response to the rising edge in the signal at its reset input, bistable gate 56 resets its inverting output to logic high. The falling edge of pulse 104 does not trigger bistable gates 46, 48, and 56 and their inverting outputs remain at logic high. Therefore, AND gate 59 switches to logic low between time $t_{15}$, which is a time interval Δt proceeding time $t_{16}$, and time $t_{16}$ in response to the falling edge of pulse 104 in second channel input signal 102.

Between time $t_{16}$ and time $t_{18}$, signal 101 at input terminal 31 is at a logic high and signal 102 at input terminal 33 is at a logic low. The input signal is in a differential mode. Delay gates 44 and 54 transmit the logic high and logic low signals, respectively, to the two inputs of AND gate 64. AND gate 64 generates a logic low signal. At time $t_{18}$, a falling edge of pulse 103 in first channel signal 101 reaches input terminal 31. The falling edge of pulse 103 is transmitted to the data input of bistable gate 48 via inverter 47. In response to the rising edge at its data input, bistable gate 48 generates a logic low signal at its inverting output. In a time interval Δt thereafter, the falling edge of pulse 103 is transmitted to the reset input of bistable gate 48 via delay gate 44 and inverter 43. In response to the rising edge at its reset input, bistable gate 48 resets its inverting output to logic high. The falling edge of pulse 103 does not trigger bistable gates 46, 56, and 58 and their inverting outputs remain at logic high. Therefore, AND gate 49 switches to logic low for a period of Δt proceeding time $t_{18}$ in response to the falling edge of pulse 103 in second channel input signal 101.

After time $t_{18}$, signals 101 and 102 are at logic low. The inverting outputs of bistable gates 46, 48, 56, and 58 are at logic high. The output of AND gate 64 is at logic low.

NAND gate 66 combines the output signals of AND gates 49, 59, and 64.

Before time $t_{11}$, NAND gate 66 generates a logic high signal in response to the logic low output signal of AND gate 64, turning on AND gates 67 and 69. The logic low voltage signals at input terminals 31 and 33 are transmitted to output terminals 61 and 63, respectively, of control circuit 40.

Between time $t_{11}$ and time $t_{12}$, NAND gate 66 generates a logic high signal in response to the logic low output signal of AND gate 64, turning on AND gates 67 and 69. Input signals 101 and 102 are transmitted to output terminals 61 and 63 through AND gates 67 and 69, respectively. Therefore, first channel output signal 111 is at logic low and second channel output signal 121 is at logic high, as represented by a first portion of a pulse 122 in signal 121, between time $t_{11}$ and time $t_{12}$.

Between time $t_{12}$ and time $t_{14}$, NAND gate 66 generates a logic high output signal in response to the logic low output signal of AND gate 49. AND gates 67 and 69 are switched on, transmitting the logic high signals from input terminals 31 and 33 to output terminals 61 and 63, respectively, as shown as a pulse 112 in output signal 111 and a second portion of pulse 122 in output signal 121. Time $t_{14}$ is at time interval Δt following time $t_{12}$. Therefore, pulse 112 has a pulse width equal to the minimum pulse width Δt, and pulse 122 has a width equal to the differential mode component width between time $t_{11}$ and time $t_{12}$ plus the minimum pulse width Δt.

Between time $t_{14}$ and time $t_{15}$, NAND gate 66 generates a logic low output signal in response to the logic high output signals of AND gates 49, 59, and 64. AND gates 67 and 69 are switched off, blocking the common mode logic high input signals and deleting a central portion of the common mode component of the differential PWM signal.

Between time $t_{15}$ and time $t_{16}$, NAND gate 66 generates a logic high output signal in response to the logic low output signal of AND gate 59. AND gates 67 and 69 are switched on, transmitting the logic high signals from input terminals 31 and 33 to output terminals 61 and 63, respectively, as shown as a first portion of a pulse 114 in output signal 111 and a pulse 124 in output signal 121. Time $t_{15}$ is at time interval Δt proceeding time $t_{16}$. Therefore, pulse 124 has a pulse width equal to the minimum pulse width Δt.

Between time $t_{16}$ and time $t_{18}$, NAND gate 66 generates a logic high signal in response to the logic low output signal of AND gate 64, turning on AND gates 67 and 69. Input signals 101 and 102 are transmitted to output terminals 61 and 63 through AND gates 67 and 69, respectively. Therefore, first channel output signal 111 is at logic high, as represented by a second portion of a pulse 114 in signal 111, and second channel output signal 121 is at logic low. Pulse 114 has a pulse width equal to the minimum pulse width Δt plus the differential mode component width between time $t_{16}$ and time $t_{18}$.

After time $t_{18}$, NAND gate 66 generates a logic high signal in response to the logic low output signal of AND gate 64, turning on AND gates 67 and 69. The logic low voltage signals at input terminals 31 and 33 are transmitted to output terminals 61 and 63, respectively, of control circuit 40.

As described herein above, AND gates 67 and 69 are conductive during the differential mode and logic low common mode. In the logic high common mode, AND gates 67 and 69 are off except during a time interval Δt following a rising edge or proceeding a falling edge. Therefore control circuit 40 deletes a central portion of the logic high common mode component while preserving pulses of the minimum pulse width Δt the edges of the input signal pulses, as shown in FIG. 3 as pulses 112 in first channel output signal 111 and pulse 124 in second channel output signal 121.

Between time $t_{21}$ and time $t_{28}$, FIG. 3 illustrates a second exemplary operation mode, in which input differential PWM signals 101 and 102 have significant differential mode components, and a small common mode component. Signal 101 has a pulse 105 of substantially full duty cycle with a rising edge at time $t_{21}$ and a falling edge at time $t_{28}$, and signal 102 has a pulse 106 with a rising edge at time $t_{24}$ and a falling edge at time $t_{26}$. Therefore, signals 101 and 102 are in common mode between time $t_{24}$ and time $t_{26}$. Between time $t_{21}$ and time $t_{24}$ and between time $t_{26}$ and time $t_{28}$, signals 101 and 102 are in differential mode. By way of example, the width of pulse 106, i.e., a time difference between time $t_{24}$, and time $t_{26}$, is less than the minimum pulse width Δt.

Before time $t_{21}$, signals 101 and 102 are at logic low. The output of AND gate 64 is at logic low. NAND gate 66 generates a logic high signal in response to the logic low output signal of AND gate 64, turning on AND gates 67 and 69. The logic low voltage signals at input terminals 31 and 33 are transmitted to output terminals 61 and 63, respectively.

At time $t_{21}$, a rising edge of pulse 105 in first channel signal 101 reaches input terminal 31. The rising edge of pulse 105 is transmitted to the data input of bistable gate 46 through delay gate 44. In response thereto, bistable gate 46 generates a logic low signal at its inverting output. In a time interval Δt thereafter, the rising edge of pulse 105 is transmitted to the reset input of bistable gate 46 via delay gate 42. In response thereto, bistable gate 46 resets its inverting output to logic high. Therefore, AND gate 49 switches to logic low for a period of Δt following time $t_{21}$ in response to the rising edge of pulse 105. Between time $t_{21}$ and time $t_{24}$, signal 101 at input terminal 31 is at a logic high and signal 102 at input terminal 33 is at a logic low. The input signal is in a differential mode. Delay gates 44 and 54 transmit the logic high and logic low signals, respectively, to the two inputs of AND gate 64. AND gate 64 generates a logic low signal. Therefore, NAND gate 66 generates a logic high signal in response to the logic low output signal of AND gate 64, turning on AND gates 67 and 69 between time $t_{21}$ and time $t_{24}$. Input signals 101 and 102 are transmitted to output terminals 61 and 63 through AND gates 67 and 69, respectively. Therefore, first channel output signal 111 is at logic high, as represented by a first portion of a pulse 116 in signal 111, and second channel output signal 121 is at logic low between time $t_{21}$ and time $t_{24}$.

At time $t_{24}$, a rising edge of pulse 106 in second channel signal 102 reaches input terminal 33. The rising edge of pulse 106 is transmitted to the data input of bistable gate 56 through delay gate 54. In response thereto, bistable gate 56 generates a logic low signal at its inverting output. In a time interval Δt thereafter, the rising edge of pulse 106 is transmitted to the reset input of bistable gate 56 via delay gate 52. In response thereto, bistable gate 56 resets its inverting output to logic high. Therefore, AND gate 59 switches to logic low at time $t_{24}$ and for a period Δt thereafter in response to the rising edge of pulse 106. Because the width of pulse 106 is less than the predetermined minimum pulse width Δt, a time interval Δt after time $t_{24}$ is after time $t_{26}$ in FIG. 3. Between time $t_{24}$ and time $t_{26}$ signal 101 at input terminal 31 and signal 102 at input terminal 33 are at logic high. The input signal is in a common mode. Delay gates 44 and 54 transmit the logic high signals to the two inputs of AND gate 64. AND gate 64 generates a logic high signal between time $t_{24}$ and time $t_{26}$. At time $t_{26}$, a falling edge of pulse 106 in second channel signal 102 reaches input terminal 33. The falling edge of pulse 106 is transmitted to the data input of bistable gate 58 through inverter 57. In response thereto, bistable gate 58 generates a logic low signal at its inverting output. In a time interval Δt thereafter, the falling edge of pulse 106 is transmitted to the reset input of bistable gate 58 via delay gate 54 and inverter 53. In response thereto, bistable gate 56 resets its inverting output to logic high. Therefore, AND gate 59 switches to logic low for a time interval Δt proceeding time $t_{26}$ in response to the falling edge of pulse 106. A time interval Δt preceding time $t_{26}$ is before time $t_{24}$ in FIG. 3. NAND gate 66 generates a logic high output signal in response to the logic low output signals of AND gates 49 and 59 between time $t_{24}$ and time $t_{26}$, turning on AND gates 67 and 69 to transmit the logic high signals from input terminals 31 and 33 to output terminals 61 and 63, respectively, as shown as a second portion of pulse 116 in output signal 111 and a pulse 126 in output signal 121.

Between time $t_{26}$ and time $t_{28}$, signal 101 at input terminal 31 is at a logic high and signal 102 at input terminal 33 is at a logic low. The input signal is in a differential mode. Delay gates 44 and 54 transmit the logic high and logic low signals to the two inputs of AND gate 64. AND gate 64 generates a logic low signal. At time $t_{28}$, a falling edge of pulse 105 in first channel signal 101 reaches input terminal 31. The falling edge of pulse 105 is transmitted to the data input of bistable gate 48 through inverter 47. In response thereto, bistable gate 48 generates a logic low signal at its inverting output. In a time interval $\Delta t$ thereafter, the falling edge of pulse 105 is transmitted to the reset input of bistable gate 56 via delay gate 48 and inverter 43. In response thereto, bistable gate 48 resets its inverting output to logic high. AND gate 49 switches to logic low for a period of $\Delta t$ proceeding time $t_{28}$ in response to the falling edge of pulse 105. NAND gate 66 generates a logic high signal in response to the logic low output signal of AND gate 64, turning on AND gates 67 and 69. Therefore, first channel output signal 111 is at logic high, as represented by a third portion of a pulse 116 in signal 111, and second channel output signal 121 is at logic low.

After time $t_{28}$, signals 101 and 102 are at logic low. The output of AND gate 64 is at logic low. NAND gate 66 generates a logic high signal in response to the logic low output signal of AND gate 64, turning on AND gates 67 and 69. The logic low voltage signals at input terminals 31 and 33 are transmitted to output terminals 61 and 63, respectively, of control circuit 40.

As described herein above, AND gates 67 and 69 are conductive throughout the second exemplary operation mode between time $t_{21}$ and time $t_{28}$. Therefore, output signal pulses 116 and 126 are substantially identical to input signal pulses 105 and 106, respectively, as shown in FIG. 3. This is because input signals 101 and 102 are substantially in the differential mode. The logic high common mode component, between time $t_{24}$ and time $t_{26}$, is narrower than the minimum pulse width $\Delta t$. Accordingly, AND gates 49 and 59 are at logic low during the short logic high common mode period when AND gate 64 is at logic high, thereby keeping the output of NAND gate 66 at logic high and AND gates 67 and 69 conductive throughout the time period between time $t_{21}$ and time $t_{28}$.

Between time $t_{31}$ and time $t_{38}$, FIG. 3 illustrates a third exemplary operation mode, in which input differential PWM signals 101 and 102 have pulses 107 and 108, respectively, substantially in common mode. Pulses 107 and 108 have their rising edges substantially at the same time $t_{31}$ and their falling edges substantially at the same time $t_{33}$. In addition, pulse 107 and 108 are of substantially 50% duty cycle. This operation mode corresponds to a situation in an digital amplifying application when there is substantially no input signal for class-D amplifier 10 shown in FIG. 1.

In accordance with a specific embodiment of the present invention, control circuit 40 does not include zero differential mode signal detection element 62 shown in FIG. 1. In this embodiment, the output of NAND gate 66 is determined by the signal levels at its three inputs transmitted from AND gates 49, 59, and 64.

Before time $t_{31}$, signals 101 and 102 are at logic low. The inverting outputs of bistable gates 46, 48, 56, and 58 are at logic high. The output of AND gate 64 is at logic low.

At time $t_{31}$, a rising edge of pulse 107 in first channel signal 101 and a rising edge of pulse 108 in second channel input signal 102 reach input terminals 31 and 33, respectively. The rising edge of pulse 107 is transmitted to the data input of bistable gate 46 through delay gate 44. In response thereto, bistable gate 46 generates a logic low signal at its inverting output. In a time interval $\Delta t$ thereafter, the rising edge of pulse 107 is transmitted to the reset input of bistable gate 46 via delay gate 42. In response thereto, bistable gate 46 resets its inverting output to logic high. Likewise, the rising edge of pulse 108 is transmitted to the data input of bistable gate 56 through delay gate 54. In response thereto, bistable gate 56 generates a logic low signal at its inverting output. In a time interval $\Delta t$ thereafter, the rising edge of pulse 108 is transmitted to the reset input of bistable gate 56 via delay gate 52. In response thereto, bistable gate 56 resets its inverting output to logic high. Therefore, AND gates 49 and 59 switch to logic low for a period between time $t_{31}$ and time $t_{34}$, which is a time interval $\Delta t$ following time $t_{31}$, in response to the rising edges of pulse 107 in first channel input signal 101 and pulse 108 in second channel input signal 102.

Between time $t_{31}$ and time $t_{38}$, signal 101 at input terminal 31 and signal 102 at input terminal 33 are at logic high. The input signal is in a common mode. Delay gates 44 and 54 transmit the logic high signals to the two inputs of AND gate 64. AND gate 64 generates a logic high signal between time $t_{31}$ and time $t_{38}$.

At time $t_{38}$, a falling edge of pulse 107 in first channel signal 101 and a falling edge of pulse 108 in second channel signal 102 reach input terminals 31 and 33, respectively. The falling edge of pulse 107 is transmitted to the data input of bistable gate 48 through inverter 47. In response thereto, bistable gate 48 generates a logic low signal at its inverting output. In a time interval $\Delta t$ thereafter, the falling edge of pulse 107 is transmitted to the reset input of bistable gate 48 via delay gate 44 and inverter 43. In thereto, bistable gate 46 resets its inverting output to logic high. Likewise, the falling edge of pulse 108 is transmitted to the data input of bistable gate 58 through inverter 57. In response thereto, bistable gate 58 generates a logic low signal at its inverting output. In a time interval $\Delta t$ thereafter, the falling edge of pulse 108 is transmitted to the reset input of bistable gate 58 via delay gate 54 and inverter 53. In response thereto, bistable gate 58 resets its inverting output to logic high. Therefore, AND gates 49 and 59 switch to logic low between time $t_{36}$, which is a time interval $\Delta t$ proceeding time $t_{38}$, and time $t_{38}$ in response to the falling edges of pulse 107 in first channel input signal 101 and pulse 108 in second channel input signal 102.

After time $t_{38}$, signals 101 and 102 are at logic low. The inverting outputs of bistable gates 46, 48, 56, and 58 are at logic high. The output of AND gate 64 is at logic low.

NAND gate 66 combines the output signals of AND gates 49, 59, and 64.

Before time $t_{31}$, NAND gate 66 generates a logic high signal in response to the logic low output signal of AND gate 64, turning on AND gates 67 and 69. The logic low voltage signals at input terminals 31 and 33 are transmitted to output terminals 61 and 63, respectively, of control circuit 40.

Between time $t_{31}$ and time $t_{34}$, NAND gate 66 generates a logic high output signal in response to the logic low output signals of AND gates 49 and 59. AND gates 67 and 69 are switched on, transmitting the logic high signals from input terminals 31 and 33 to output terminals 61 and 63, respectively, as shown as a pulse 118 in output signal 111 and a pulse 128 in output signal 121. Time $t_{34}$ is at time interval $\Delta t$ after rising edge time $t_{31}$. Therefore, the widths of pulses 118 and 128 are equal to the minimum pulse width $\Delta t$.

Between time $t_{34}$ and time $t_{36}$, NAND gate 66 generates a logic low output signal in response to the logic high output signals of AND gates 49, 59, and 64. AND gates 67 and 69 are switched off, blocking the common mode logic high input signals and deleting a central portion of the common mode component of the differential PWM signal.

Between time $t_{36}$ and time $t_{38}$, NAND gate 66 generates a logic high output signal in response to the logic low output signal of AND gates 49 and 59. AND gates 67 and 69 are switched on, transmitting the logic high signals from input terminals 31 and 33 to output terminals 61 and 63, respectively, as shown as a pulse 119 in output signal 111 and a pulse 129 in output signal 121. Time $t_{36}$ is at time interval $\Delta t$ proceeding falling edge time $t_{38}$. Therefore, each of pulses 119 and 129 has a pulse width equal to the minimum pulse width $\Delta t$.

After time $t_{38}$, NAND gate 66 generates a logic high signal in response to the logic low output signal of AND gate 64, turning on AND gates 67 and 69. The logic low voltage signals at input terminals 31 and 33 are transmitted to output terminals 61 and 63, respectively, of control circuit 40.

As described herein above, there is substantially no differential mode in the third exemplary operation mode. In the common mode, AND gates 67 and 69 are off except during a time interval $\Delta t$ following a rising edge and a time interval $\Delta t$ proceeding a falling edge. Therefore, control circuit 40 deletes a central portion of the logic high common mode component while preserving pulses of minimum pulse width $\Delta t$ adjacent the edges of the input signal pulses, as shown in FIG. 3 as pulses 118 and 119 in first channel output signal 111 and pulses 128 and 129 in second channel output signal 121.

In accordance with another specific embodiment of the present invention, control circuit 40 includes zero differential mode signal detection element 62 as shown in FIG. 1. In this embodiment, signal detection element 62 detects the differential mode component in the differential PWM input signals. Between time $t_{31}$ and time $t_{38}$, both signal 101 at input terminal 31 and signal 102 at input terminal 33 are at logic high. The input signal is substantially in a logic high common mode and the differential mode component is substantially zero. In response to the substantially zero differential mode component, signal detection element 62 generates logic signal, which is transmitted to the override input of NAND gate 66. In response thereto, NAND gate 66 generates a logic low voltage level at its output regardless of the status of the input signals at its three inputs. AND gates 67 and 69 are off throughout the third exemplary operation mode. The output signals of control circuit 40 at output terminals 61 and 63 stay at logic low throughout the time period between time $t_{31}$ and time $t_{38}$. Therefore, pulses 118 and 128 corresponding to the rising edges of the input signal and pulses 119 and 129 corresponding to the falling edges of the input signal (shown in FIG. 3) are not present in this specific embodiment. This implementation prevents narrow current pulses that do not generate meaningful output, e.g., audio signals, from flowing through load 25 shown in FIG. 1. This is beneficial in further reducing the dynamic power consumption of power switching elements 12, 14, 16, and 18 in H-bridge 11 and further reducing the EMI radiation of amplifier 10.

By now it should be appreciated that a scheme or process for modulating PWM signal and a circuit for implementing the signal modulation process have been provided. In accordance with an embodiment of the present invention, a transform logic circuit or control circuit generates H-bridge control signals from a differential PWM input signal in a nonlinear amplifier. In accordance with a preferred embodiment of the present invention, the control circuit transmits the differential mode component of the input PWM signal to the H-bridge and partially blocks the common mode component of the input PWM signal. Specifically, the control circuit blocks a central portion of common mode signal pulses and transmits common mode signal pulses of a predetermined minimum pulse width near the rising and falling edges thereof. For an input signal pulse with width less than the minimum pulse width, the control circuit transmits the complete pulse to the H-bridge. In accordance with a preferred embodiment, the predetermined minimum pulse width is sufficiently wide to reliably switch on and off the switching devices, e.g., field effect transistors, bipolar transistors, etc., in the H-bridge. Deleting the EMI radiation and improves the efficiency of the amplifier. Preserving the minimum pulse width at the pulse edges ensures that the switching elements H-bridge switching on and off properly at the pulse edges. This is beneficial in significantly eliminating the distortion, e.g., total harmonic distortion, in the amplified signal.

When there is no input signal for amplification, the two channels of the differential input pulse width modulation signal are in common mode with a fifty percent duty cycle. In accordance with one preferred embodiment, the control circuit generate pulses of minimum pulse width at the edges of the common mode signal pulses, indicating no signal input. In accordance with another preferred embodiment, the control circuit includes a zero signal detection element. In response to detecting the zero signal, the element generates a signal to switch off the signal transmission paths in the control circuit and completely blocks the common mode input signal pulses, thereby further reducing the EMI radiation and improving the efficiency of the amplification circuit without deterioration in the output signal fidelity.

In accordance with a specific embodiment of the present invention, the transform logic or control circuit for the signal modulation process includes simple digital circuit elements such as logic gates, latches, etc. Therefore, the circuit is reliable, power efficient, and cost efficient.

While specific embodiments of the present invention have been described herein above, they are not intended as limitations on the scope of the invention. The present invention encompasses those modifications and variations of the described embodiments that are obvious to those skilled in the art. For example, the input signals for the nonlinear amplifier are not limited to PWM signals. In accordance with the present invention, the transform logic circuit and the nonlinear amplifier may operate on other types of signals, e.g., delta-sigma signals.

The invention claimed is:

1. A signal modulation circuit for modulating a differential pulse width modulation signal, comprising:
   a first channel signal processing element having an input coupled for receiving a first channel of the differential signal, an output, and a control signal output;
   a second channel signal processing element having an input coupled for receiving a second channel of the differential signal, an output, and a control signal output;
   a first logic gate having a first input coupled to the output of said first channel signal processing element, a second input coupled to the output of said second channel signal processing element, and an output;
   a second logic gate having a first input coupled to the control signal output of said first channel signal processing element, a second input coupled to the control signal output of said second channel signal processing element, a third input coupled to the output of said first logic gate, and an output;
   a first switch having a first electrode coupled to the output of said first channel signal processing element, a second electrode coupled for transmitting a first channel of an output signal, and a control electrode coupled to the output of said second logic gate; and a second switch having a first electrode coupled to the output of said second channel signal processing element, a second electrode coupled for transmitting a second channel of the output signal, and a control electrode coupled to the output of said second logic gate.

2. The signal modulation circuit of claim 1, wherein:

said first switch includes a first logic AND gate having a first input coupled to the output of said first channel signal processing element, a second input coupled to the output of said second logic gate, and an output coupled for transmitting the first channel of the output signal; and said second switch includes a second logic AND gate having a first input coupled to the output of said second channel signal processing element, a second input coupled to the output of said second logic gate, and an output coupled for transmitting the second channel of the output signal.

3. The signal modulation circuit of claim 1, said first channel signal processing element comprising:

a first delay gate having an input and an output coupled to the input and the output, respectively, of said first channel signal processing element;

a second delay gate having an input coupled to the input of said first channel signal processing element and an output;

a first storage element having a first input and a second input coupled to the input and the output, respectively, of said first delay gate, and an output;

a second storage element having a first input and a second input coupled to the outputs of said first delay gate and said second delay gate, respectively, and an output; and a logic gate having a first input and a second input coupled to the outputs of said first and second storage elements, respectively, and an output coupled to the control signal output of said first channel signal processing element.

4. The signal modulation circuit of claim 1, wherein said first logic gate includes a logic AND gate and said second logic gate includes a logic NAND gate.

5. The signal modulation circuit of claim 1, said second channel signal processing element comprising:

a first delay gate having a first delay time and having an input coupled to the input of said second channel signal processing element and an output coupled to the output of said second channel signal processing element;

a second delay gate having a second delay time different from the first delay time and having an input coupled to the input of said second channel signal processing element and an output;

a first bistable gate having a data input coupled to the input of said second channel signal processing element, a reset input coupled to the output of said first delay gate, and an inverted output;

a second bistable gate having a first input coupled to the output of said first delay gate, a second input coupled to the output of said second delay gate, and an inverted output; and a logic AND gate having a first input coupled to the inverted output of said first bistable gate, a second input coupled to the inverted output of said second bistable gate, and an output coupled to the control signal output of said second channel signal processing element.

6. The signal modulation circuit of claim 5, said second channel signal processing element further comprising:

a first inverter coupled between the input of said second channel signal processing element and the data input of said first bistable gate; and a second inverter coupled between the output of said first delay gate and the reset input of said first bistable gate.

7. The signal modulation circuit of claim 1, further comprising a zero differential mode signal detection element having first and second inputs coupled to the outputs of said first and second channel signal processing elements, respectively, and an output coupled to said second logic gate.

8. A nonlinear amplifier, comprising:

a transform logic circuit coupled for receiving a differential signal and including:

a logic AND gate coupled for receiving the differential signal and configured to generate an output signal at an output thereof and at a first logic level in response to first and second components of the differential signal being at the first logic level;

a first processing element and a second processing element, each coupled for receiving a corresponding component of the differential signal and configured to generate a corresponding control signal at the first logic level and switching to a second logic level for a predetermined time interval following a rising edge and preceding a falling edge in the corresponding component of the differential signal; and a switching element having first and second inputs coupled for receiving a corresponding component of the differential signal and first and second outputs, said switching element being conductive between the first input and output and between the second input and output in response to at least one of the first control signal, the second control signal, and the output signal of said logic AND gate being at the second logic level; and a switching bridge having first and second control terminals coupled to the first and second outputs, respectively, of said switching element in said transform logic circuit.

9. The nonlinear amplifier of claim 8, wherein each of said first processing element and said second processing element in said transform logic circuit includes:

a first delay gate having a first delay time and having an input coupled for receiving a corresponding component of the differential signal and an output coupled to a corresponding input of said switching element;

a second delay gate having a second delay time and having an input coupled to the input of said first delay gate and an output;

a first bistable gate having a first input coupled to the input of said first delay gate, a second input coupled to the output of said first delay gate, and an output;

a second bistable gate having a first input coupled to the output of said first delay gate, a second input coupled to the output of said second delay gate, and an output; and an AND gate having a first input coupled to the output of said first bistable gate, a second input coupled to the output of said second bistable gate, and an output.

10. The nonlinear amplifier of claim 9, wherein each of said first processing element and said second processing element in said transform logic circuit further includes a first inverter coupled between the input of said first delay gate and the first input of said first bistable gate and a second inverter coupled between the output of said first delay gate and the second input of said first bistable gate.

11. The nonlinear amplifier of claim 9, wherein said switching element in said transform logic circuit includes:

a logic NAND gate having a first input coupled to the output of said AND gate in said first processing element, a second input coupled to the output of said AND gate in said second processing element, a third input coupled to the output of said logic AND gate, and an output;

a first AND gate having a first input coupled to the output of said first delay gate in said first processing element, a second input coupled to the output of said logic NAND gate, and an output coupled to the first control terminal of said switching bridge; and a second AND gate having a first input coupled to the output of said first delay gate in said second processing element, a second input coupled to the output of said logic NAND gate, and an output coupled to the second control terminal of said switching bridge.

12. The nonlinear amplifier of claim 11, said transform logic circuit further including a zero signal detection element having first and second inputs coupled to the outputs of said first delay gates in said first and second processing elements, respectively, and an output coupled to said logic NAND gate.

13. The nonlinear amplifier of claim 9, wherein:
the first delay time of said first delay gate in each of said first processing element and said second processing element in said transform logic circuit is substantially equal to the predetermined time interval; and
the second delay time of said second delay gate each of said first processing element and said second processing element in said transform logic circuit is substantially equal to twice of the predetermined time interval.

14. The nonlinear amplifier of claim 8, said switching bridge including:
a first switch having a control electrode coupled to the first output of said switching element in said transform logic circuit, a first current conducting electrode coupled to a first voltage level, and a second current conducting electrode coupled to a first output terminal of the nonlinear amplifier;
a second switch having a control electrode coupled to the control electrode of said first switch, a first current conducting electrode coupled to a second voltage level, and a second current conducting electrode coupled to the second current conducting electrode of said first switch;
a third switch having a control electrode coupled to the second output of said switching element in said transform logic circuit, a first current conducting electrode coupled to the first voltage level, and a second current conducting electrode coupled to a second output terminal of the nonlinear amplifier; and
a fourth switch having a control electrode coupled to the control electrode of said third switch, a first current conducting electrode coupled to the second voltage level, and a second current conducting electrode coupled to the second current conducting electrode of said third switch.

15. The nonlinear amplifier of claim 14, wherein:
said first switch includes a first pull-up field effect transistor;
said second switch includes a first pull-down field effect transistor;
said third switch includes a second pull-up field effect transistor; and
said fourth switch includes a second pull-down field effect transistor.

16. A signal modulation process, comprising the steps of:
providing a differential signal having a first channel and a second channel;
generating a first control signal and a second control signal at a first logic level;
switching the first control signal to a second logic level for a predetermined time interval following a rising edge and preceding a falling edge in the first channel of the differential signal;
switching the second control signal to the second logic level for the predetermined time interval following a rising edge and preceding a falling edge in the second channel of the differential signal; and
generating a modified signal by blocking a transmission of the differential signal in response to the first and second channels of the differential signal being at logic high and the first and second control signals at the first logic level.

17. The signal modulation process of claim 16, wherein the step of switching the first control signal to a second logic level for a predetermined time interval following a rising edge and preceding a falling edge in the first channel of the differential signal further includes the steps of:
generating a first delayed signal by delaying the first channel of the differential signal by the predetermined time interval;
generating a second delayed signal by delaying the first channel of the differential signal by two times of the predetermined time interval;
generating a first logic signal and a second logic signal at the first logic level;
in response to a rising edge in the first delayed signal, switching the first logic signal to the second logic level;
in response to a rising edge in the second delayed signal, switching the first logic signal back to the first logic level;
in response to a falling edge in the first channel of the differential PWM, switching the second logic signal to the second logic level;
in response to a falling edge in the first delayed signal, switching the second logic signal back to the first logic level; and
generating the first control signal at the first logic level in response to the first logic signal and the second logic signal at the first logic level and at the second logic level in response to at least one of the first logic signal and the second logic signal at the second logic level.

18. The signal modulation process of claim 17, wherein the step of generating a modified signal further includes the steps of:
generating a third control signal at the first logic level in response to the first delayed signal corresponding to the first channel of the differential signal and a first delayed signal corresponding to the second channel of the differential signal at the first logic level and at the second logic level in response to at least one of the first delayed signals corresponding to the first and second channels of the differential signal at the second logic level;
transmitting the first delayed signals corresponding to the first and second channels of the differential signal in response to at least one of the first, second, and third control signals at the second logic level; and
blocking the first delayed signals corresponding to the first and second channels of the differential signal in response to the first, second, and third control signals at the first logic level.

19. The signal modulation process of claim 16, wherein the step of generating a modified signal further includes the step of blocking the differential signal in response to a difference between the first and second channels of the differential signal being less than a predetermined value.

20. The signal modulation process of claim 16, further comprising the step of transmitting the modified signal to a switching bridge in a nonlinear amplifier.

* * * * *